(12) United States Patent
Lee et al.

(10) Patent No.: US 9,406,513 B2
(45) Date of Patent: Aug. 2, 2016

(54) GRAPHENE LAMINATE WITH BAND GAP

(71) Applicant: Samsung Electronics Co., Ltd., Suwon-si, Gyeonggi-Do (KR)

(72) Inventors: Si-Young Lee, Seoul (KR); Young-hee Lee, Seoul (KR); Jae-young Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 14/186,055

(22) Filed: Feb. 21, 2014

(65) Prior Publication Data

US 2014/0299840 A1 Oct. 9, 2014

(30) Foreign Application Priority Data

Apr. 9, 2013 (KR) ........................ 10-2013-0038845

(51) Int. Cl.
*H01L 29/16* (2006.01)
*H01L 21/18* (2006.01)
*H01L 29/786* (2006.01)
*H01L 29/778* (2006.01)

(52) U.S. Cl.
CPC ............ *H01L 21/18* (2013.01); *H01L 29/1606* (2013.01); *H01L 29/78684* (2013.01); *H01L 29/778* (2013.01)

(58) Field of Classification Search
CPC ................ H01L 29/1606; H01L 21/18; H01L 29/78684; H01L 29/778; H01L 29/16; H01L 29/4908; H01L 29/7781; H01L 29/7843; H01L 21/04

USPC .............. 257/29, E21.051, E29.082; 438/466
See application file for complete search history.

(56) References Cited

U.S. PATENT DOCUMENTS

| | | | |
|---|---|---|---|
| 2011/0101309 A1* | 5/2011 | Lin | ..................... H01L 29/1606 257/29 |
| 2011/0309336 A1 | 12/2011 | Shin et al. | |
| 2011/0313194 A1 | 12/2011 | Lee et al. | |
| 2012/0068161 A1 | 3/2012 | Lee et al. | |
| 2012/0153119 A1 | 6/2012 | Patil et al. | |

FOREIGN PATENT DOCUMENTS

| | | | |
|---|---|---|---|
| JP | 2012082093 A | 4/2012 | |
| KR | 100819458 B1 | 4/2008 | |
| KR | 20100108106 A | 10/2010 | |
| KR | 20110081519 A | 7/2011 | |
| KR | 101071110 B1 | 10/2011 | |

* cited by examiner

*Primary Examiner* — Selim Ahmed

(74) *Attorney, Agent, or Firm* — Harness, Dickey & Pierce, P.L.C.

(57) ABSTRACT

A graphene laminate includes a first piezoelectric material layer having a negatively-charged surface and a positively-charged surface, a first graphene layer under the first piezoelectric material layer, the first graphene layer contacting the positively-charged surface of the first piezoelectric material layer, a second graphene layer underlying the first graphene layer, and a second piezoelectric material layer under the second graphene layer, the second piezoelectric material layer having a negatively-charged surface and a positively-charged surface, the negatively-charged surface contacting the second graphene layer.

19 Claims, 3 Drawing Sheets

GRAPHENE LAMINATE WITH BAND GAP

CROSS-REFERENCE TO RELATED APPLICATIONS

This application claims the benefit of Korean Patent Application No. 10-2013-0038845, filed on Apr. 9, 2013, in the Korean Intellectual Property Office, the entire disclosure of which is incorporated herein by reference.

BACKGROUND

1. Field

Some example embodiments relate to graphene, and more particularly, to graphene as a material for electronic devices.

2. Description of the Related Art

Graphene is a two-dimensional structure of a monatomic layer of carbon. Graphene has a unique band structure, a relatively high electron mobility of about 200,000 $cm^2V^{-1}s^{-1}$, and a quantum hole effect (QHE) at room temperature. However, graphene has no band gap, and is not applicable in electronic devices, specifically in switching devices, such as transistors. Therefore, research has been conducted to render a band gap to graphene.

For example, to open a band gap in graphene, graphene may be patterned into nanoribbons having a width of about 10 nm or less. However, forming graphene nanoribbons with a band gap requires the use of expensive special equipment. Furthermore, manufacturing a relatively large array of graphene nanoribbons for integrated circuits is extremely difficult with the current technology.

Another method of opening a band gap in graphene is using AB-stacked graphene. A band gap in graphene may be induced by breaking the symmetry in a band structure of a two-layered graphene laminate with an AB-stacked structure. For example, a relatively strong electric field may be applied between opposite surfaces of the two-layered graphene laminate to open a band gap in the AB-stacked graphene. This method uses a relatively high voltage.

Another method of opening a band gap in graphene is doping one or opposite surfaces of single-layer graphene or double-layer graphene with a dopant. However, a charge transfer from the dopant to the graphene may cause a doping state in graphene, consequently leading to increased scattering and reduced mobility of charges in graphene. Furthermore, it is difficult to control a doping concentration of the dopant in graphene with this method.

SUMMARY

Some example embodiments provide graphene laminates with relatively high charge mobility and a band gap.

Additional aspects will be set forth in part in the description which follows and, in part, will be apparent from the description, or may be learned by practice of example embodiments.

According to an example embodiment, a graphene laminate includes a first piezoelectric material layer having a negatively-charged surface and a positively-charged surface, a first graphene layer under the first piezoelectric material layer, the first graphene layer contacting the positively-charged surface of the first piezoelectric material layer, a second graphene layer underlying the first graphene layer, and a second piezoelectric material layer under the second graphene layer, the second piezoelectric material layer having a negatively-charged surface and a positively-charged surface, the negatively-charged surface contacting the second graphene layer.

According to another example embodiment, a method of preparing a graphene laminate with a band gap includes applying an electric field to a laminate, the laminate including a first piezoelectric material layer, a first graphene layer underlying the first piezoelectric material layer, a second graphene layer underlying the first graphene layer, and a second piezoelectric material layer underlying the second graphene layer.

According to another example embodiment, a graphene laminate includes a first piezoelectric material layer, a first graphene layer underlying the first piezoelectric material layer, a second graphene layer underlying the first graphene layer, and a second piezoelectric material layer underlying the second graphene layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
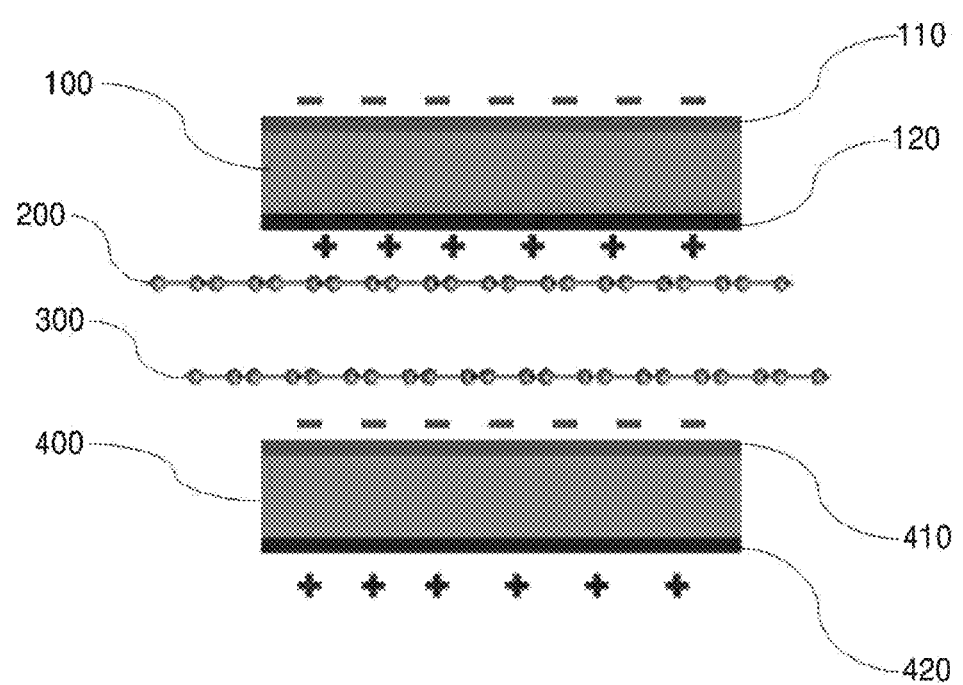
FIG. 1 is a sectional view of a graphene laminate according to an example embodiment.

Reference will now be made in detail to the inventive concepts, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a sectional view of a graphene laminate according to an example embodiment.

Referring to FIG. 1, the graphene laminate includes a first piezoelectric material layer 100, a first graphene layer 200, a second graphene layer 300, and a second piezoelectric material layer 400. Opposite upper and lower surfaces of the first piezoelectric material layer 100 may be negatively and positively charged, respectively. The first piezoelectric material layer 100 has a negatively-charged surface 110 and a positively-charged surface 120. The first graphene layer 200 is disposed under the first piezoelectric material layer 100. The first graphene layer 200 is a single-layered graphene sheet. An upper surface of the first graphene layer 200 contacts the positively-charged surface 120 of the first piezoelectric material layer 100. The second graphene layer 300 is disposed under the first graphene layer 200. The second graphene layer 300 is a single-layered graphene sheet.

Accordingly, the first graphene layer 200 and the second graphene layer 300 form a double-layered graphene sheet. The first graphene layer 200 and the second graphene layer 300 form an AB-stacked structure. The second piezoelectric material layer 400 is disposed under the second graphene layer 300. Opposite upper and lower surfaces of the second piezoelectric material layer 400 may be negatively and positively charged, respectively. The second piezoelectric material layer 400 has a negatively-charged surface 410 and a positively-charged surface 420. The negatively-charged surface 410 of the second piezoelectric material layer 400 contacts the second graphene layer 300.

The first graphene layer 200 and the second graphene layer 300 are disposed between the positively-charged surface 120 of the first piezoelectric material layer 100 and the negatively-charged surface 410 of the second piezoelectric material layer 400. A distance between the positively-charged surface 120 of the first piezoelectric material layer 100 and the negatively-charged surface 410 of the second piezoelectric material layer 400 is relatively short and equal to the sum of the thicknesses of the first graphene layer 200 and the second graphene layer 300. Thus, a relatively strong electric field may be generated between the positively-charged surface 120 of the first piezoelectric material layer 100 and the negatively-charged surface 410 of the second piezoelectric material layer 400. Symmetry in band structure between the first graphene layer 200 and the second graphene layer 300 may be broken by this relatively strong electric field, and consequently, a band gap of the double-layered graphene sheet comprising the first graphene layer 200 and the second graphene layer 300 may be opened.

The first piezoelectric material layer 100 and the second piezoelectric material layer 400 may be formed of, for example, a material selected from quartz, lead zirconate titanate (PZT, $Pb[Zr_xTi_{1-x}]O_3$, where $0 \leq x \leq 1$), gallium orthophosphate, langasite, barium titanate, lead titanate, potassium niobate, zinc oxide, sodium tungstate, lithium tantalate, lithium niobate, polyvinylidene fluoride (PVDF), poly[(vinylidene-fluoride-co-trifluoroethylene (PVDF-TrFE), or a mixture thereof. The first piezoelectric material layer 100 and the second piezoelectric material layer 400 may be formed of the same material or a different material.

The first graphene layer 200 and the second graphene layer 300 may each be a single-layered graphene sheet. The first graphene layer 200 and the second graphene layer 300 may form an AB-stacked graphene. The AB-stacked graphene is a structure including upper and lower graphene layers stably overlapping with one another, wherein half of the carbon atoms in the upper graphene layer are located directly above half of the carbon atoms in the lower graphene layer.

Figure 2:
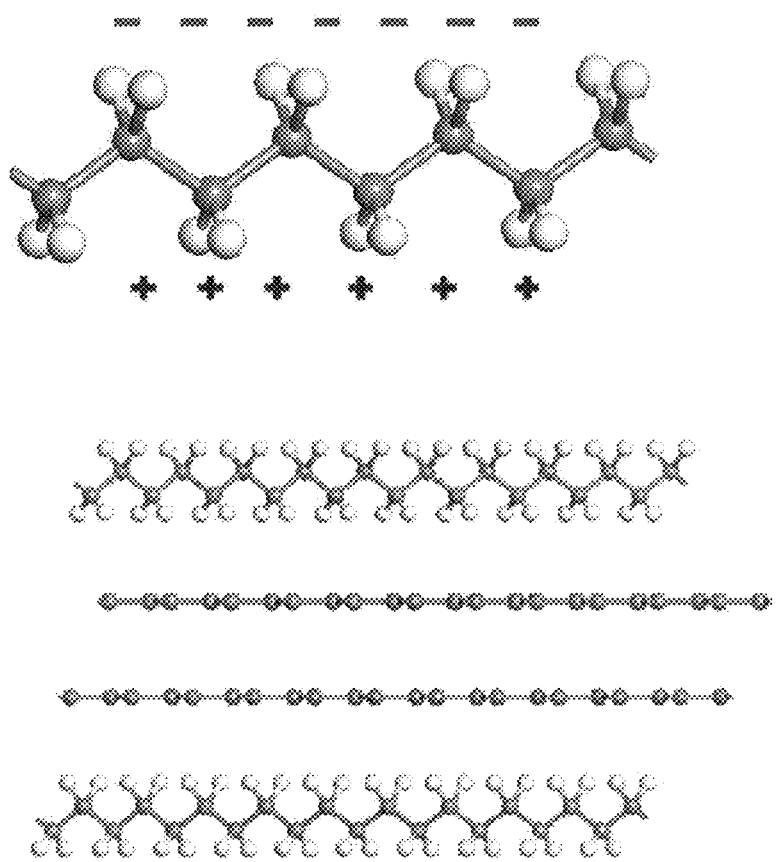
FIG. 2 illustrates a graphene laminate including two AB-stacked grapheme sheets between polyvinylidene fluoride (PVDF) layers having permanent dipoles.
Figure 3:
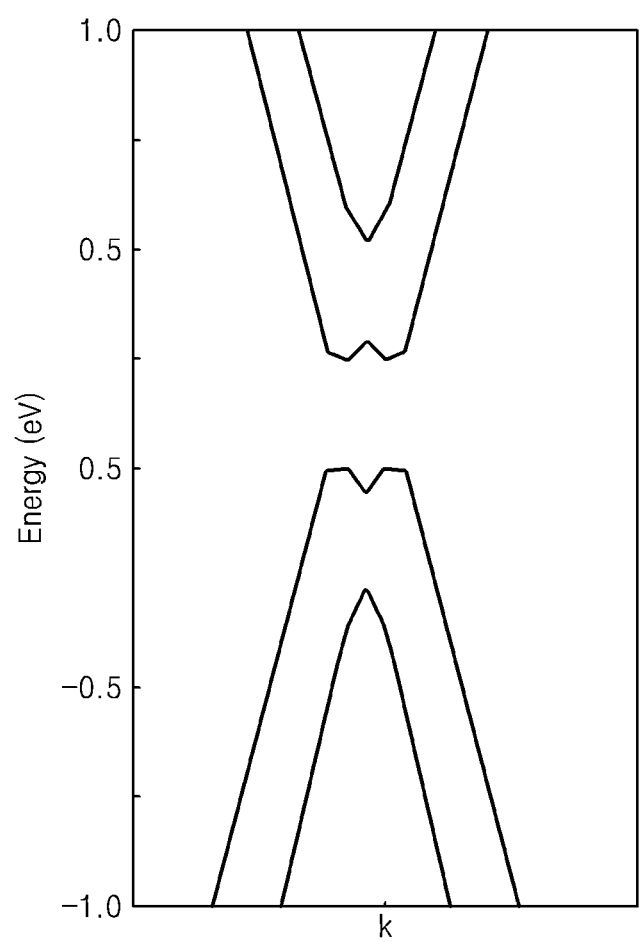
FIG. 3 illustrates a calculated band structure of the graphene laminate of FIG. 2.

In the graphene laminate of FIG. 1, the AB-stacked graphene including the first graphene layer 200 and the second graphene layer 300 may have a band gap of, for example, greater than about 0 eV and less than or equal to about 0.3 eV. A graphene laminate according to another embodiment is illustrated in FIG. 2. The graphene laminate of FIG. 2 includes two AB-stacked graphene sheets between polyvinylidene fluoride (PVDF) layers having permanent dipoles. FIG. 3 illustrates a calculated band gap of the graphene laminate of FIG. 2. Referring to FIG. 3, it was found that the two graphene sheets of the graphene laminate of FIG. 2 have a band gap of about 0.25 eV. Furthermore, a doping state is not present in the band gap of FIG. 3.

The graphene laminate according to example embodiments of the present inventive concepts may have a band gap, and no doping state appears in the graphene of the graphene laminate. Accordingly, the graphene laminate may have a charge mobility not lower than that of graphene itself. According to example embodiments of the present inventive concepts, the graphene laminate may be used in, for example, switch devices, sensor devices, high-frequency devices, optical devices, or the like. A device with faster information-processing ability than conventional Si-based devices may be manufactured using the graphene laminate with high charge-mobility according to the present inventive concepts. According to example embodiments of the present inventive concepts, the graphene laminate may also be used in flexible devices due to flexibilities of the graphene and the piezoelectric material. According to an example embodiment of the present inventive concepts, a switch device may include any of the graphene laminates according to an example embodiment. According to another example embodiment of the present inventive concepts, a sensor device may include any of the graphene laminates according to the first aspect of the present disclosure.

Hereinafter, a method of manufacturing a graphene laminate according to another example embodiment will now be described in greater detail. For example, an embodiment of a method of manufacturing a graphene laminate according to another example embodiment may include applying an electric field to a laminate, the laminate including a first piezoelectric material layer, a first graphene layer underlying the first piezoelectric material layer, a second graphene layer underlying the first graphene layer, and a second piezoelectric material layer underlying the second graphene layer.

In some embodiments, the applying of an electric field to the first laminate may include, for example, disposing the laminate between two electrodes and applying a voltage between the two electrodes. The voltage applied across the two electrodes may be, for example, from about 10V to about 100V.

When an electric field is applied to the laminate, dipoles in the piezoelectric material layers of the laminate are oriented in the direction of the electric field, and become permanent dipoles in the piezoelectric material layers of the laminate. Accordingly, the opposite surfaces of the first and second piezoelectric material layers are positively or negatively charged. The first piezoelectric material layer and the second piezoelectric material layer may have surfaces charged in the same manner. For example, when an upper surface of the first piezoelectric material layer is positively charged, an upper surface of the second piezoelectric material layer may be positively charged. In some embodiments, when a lower surface of the first piezoelectric material layer is positively charged, a lower surface of the second piezoelectric material layer may be positively charged.

According to another example embodiment, a graphene laminate includes a first piezoelectric material layer, a first graphene layer underlying the first piezoelectric material layer, a second graphene layer underlying the first graphene layer, and a second piezoelectric material layer underlying the second graphene layer. According to example embodiments of the present inventive concepts, this graphene laminate may be used as a source material in the method of manufacturing a graphene laminate described above as an example embodiment of the present inventive concepts.

The graphene laminate according to another example embodiment may be prepared, for example, as follows. A second piezoelectric material layer may be formed of a piezoelectric material on a doped silicon wafer with relatively low resistivity. Two graphene layers may be formed on the second piezoelectric material layer by using graphene separated from natural graphite, such as, for example, highly ordered pyrolytic graphite (HOPG) or Kish graphite, or by using graphene grown through chemical vapor deposition (CVD). A first piezoelectric material layer may then be formed on the two graphene layers in the same manner as the second piezoelectric material layer. For example, when using poly[(vinylidenefluoride-co-trifluoroethylene (PVDF-TrFE) as a piezoelectric material for the second piezoelectric material layer, first, a PVDF-TrFE powder may be dissolved in a concentration of about 20 wt % in dimethylformamide (DMF).

This solution may be spin-coated on a doped silicon wafer with low resistivity to a thickness of about 500 nm, followed by drying at about 60° C. to remove the DMF and form the second piezoelectric material layer. Afterwards, two graphene layers may be formed on the second piezoelectric material layer by using graphene separated from natural graphite, for example, highly ordered pyrolytic graphite (HOPG) or Kish graphite, or by using graphene grown through chemical vapor deposition (CVD). The first piezoelectric material layer may be formed on the two graphene layers by the same method as used to form the second piezoelectric material layer, thereby manufacturing a graphene laminate. An electrode may then be formed on the graphene laminate (which has been patterned by photolithography or electron beam lithography, or with a shadow mask), using an electron beam/thermal evaporator, followed by applying a voltage between the electrode and the silicon wafer to orient dipoles of the first and second piezoelectric material layers in a direction.

As described above, according to the one or more of the above example embodiments of the present inventive concepts, dipoles in a piezoelectric material layer may be artificially oriented in a direction by applying a strong electric field to the piezoelectric material layer, thus becoming permanent dipoles charging one of the opposite surfaces of the piezoelectric material layer with positive charges and the other surface with negative charges. When two graphene sheets are disposed between two piezoelectric material layers with dipoles arranged in the same direction, a strong electric field may be generated between a positively-charged surface of one of the piezoelectric material layers and a negatively-charged surface of the other piezoelectric material layer.

This strong electric field may break the symmetry in a band structure of the two graphene sheets, thereby opening a bad gap in the graphene sheets. Due to a relatively large band gap of piezoelectric material, a charge transfer may not occur between the piezoelectric material and graphene even in contact with each other, so that no doping state appears in the band gap of the graphene. For this reason, even when the two graphene sheets are disposed between the piezoelectric material layers, a charge mobility of the graphene sheets may not deteriorate. The piezoelectric material layers may also serve as insulating layers. This may simplify the manufacturing of a device since an additional insulating layer may not be formed.

It should be understood that the example embodiments described therein should be considered in a descriptive sense only and not for purposes of limitation. Descriptions of features or aspects within each embodiment should typically be considered as available for other similar features or aspects in other embodiments.

What is claimed is:

1. A graphene laminate comprising:
   a first piezoelectric material layer having a negatively-charged surface and a positively-charged surface;
   a first graphene layer under the first piezoelectric material layer, the first graphene layer contacting the positively-charged surface of the first piezoelectric material layer;
   a second graphene layer underlying the first graphene layer; and
   a second piezoelectric material layer under the second graphene layer, the second piezoelectric material layer having a negatively-charged surface and a positively-charged surface, the negatively-charged surface contacting the second graphene layer.

2. The graphene laminate of claim 1, wherein the first piezoelectric material layer and the second piezoelectric material layer comprise one of lead zirconate titanate (PZT, $Pb[Zr_xTi_{1-x}]O_3$, where $0 \leq x \leq 1$), gallium orthophosphate, langasite, barium titanate, lead titanate, potassium niobate, zinc oxide, sodium tungstate, lithium tantalate, lithium niobate, polyvinylidene fluoride (PVDF), poly[(vinylidenefluoride-co-trifluoroethylene (PVDF-TrFE), and a mixture thereof.

3. The graphene laminate of claim 1, wherein the first piezoelectric material layer and the second piezoelectric material layer comprise one of a same material and different materials.

4. The graphene laminate of claim 1, wherein the first graphene layer and the second graphene layer are each a single-layered graphene sheet.

5. The graphene laminate of claim 1, wherein the first graphene layer and the second graphene layer form an AB-stacked graphene sheet.

6. The graphene laminate of claim 1, wherein the first graphene layer and the second graphene layer have a band gap greater than 0 eV to about 0.3 eV.

7. A switching device comprising the graphene laminate of claim 1.

8. A sensor device comprising the graphene laminate of claim 1.

9. A method of preparing a graphene laminate with a band gap, the method comprising:
   applying an electric field to a laminate, the laminate including,
     a first piezoelectric material layer,
     a first graphene layer underlying the first piezoelectric material layer,
     a second graphene layer underlying the first graphene layer, and
     a second piezoelectric material layer underlying the second graphene layer.

10. The method of claim 9, wherein the applying an electric field to the laminate comprises:
- disposing the laminate between two electrodes; and
- applying a voltage across the two electrodes.

11. The method of claim 10, wherein the applying applies the voltage from about 10V to about 100V.

12. A graphene laminate comprising:
- a first piezoelectric material layer;
- a first graphene layer underlying the first piezoelectric material layer;
- a second graphene layer underlying the first graphene layer; and
- a second piezoelectric material layer underlying the second graphene layer.

13. The graphene laminate of claim 12, wherein the first piezoelectric material layer and the second piezoelectric material layer comprise one of lead zirconate titanate (PZT, $Pb[Zr_xTi_{1-x}]O_3$, where $0 \leq x \leq 1$), gallium orthophosphate, langasite, barium titanate, lead titanate, potassium niobate, zinc oxide, sodium tungstate, lithium tantalate, lithium niobate, polyvinylidene fluoride (PVDF), poly[(vinylidenefluoride-co-trifluoroethylene (PVDF-TrFE), and a mixture thereof.

14. The graphene laminate of claim 12, wherein the first piezoelectric material layer and the second piezoelectric material layer comprise one of a same material and different materials.

15. The graphene laminate of claim 12, wherein the first graphene layer and the second graphene layer are each a single-layered graphene sheet.

16. The graphene laminate of claim 12, wherein the first graphene layer and the second graphene layer form an AB-stacked graphene sheet.

17. The graphene laminate of claim 12, wherein the first graphene layer and the second graphene layer have a band gap greater than 0 eV to about 0.3 eV.

18. A switching device comprising the graphene laminate of claim 12.

19. A sensor device comprising the graphene laminate of claim 12.

* * * * *